(12) United States Patent
Lee et al.

(10) Patent No.: US 11,641,193 B2
(45) Date of Patent: May 2, 2023

(54) LATCH

(71) Applicant: Taiwan Semiconductor Manufacturing Company, Ltd., Hsinchu (TW)

(72) Inventors: Chia-Fu Lee, Hsinchu (TW); Hon-Jarn Lin, Hsinchu (TW); Yu-Der Chih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/815,322

(22) Filed: Jul. 27, 2022

(65) Prior Publication Data

US 2022/0360254 A1 Nov. 10, 2022

Related U.S. Application Data

(63) Continuation of application No. 17/162,440, filed on Jan. 29, 2021, now Pat. No. 11,469,745.

(51) Int. Cl.
*H03K 3/356* (2006.01)

(52) U.S. Cl.
CPC ............................. *H03K 3/35613* (2013.01)

(58) Field of Classification Search
CPC .................................................. H03K 3/35613
USPC .......................................................... 327/210
See application file for complete search history.

(56) References Cited

U.S. PATENT DOCUMENTS 10,965,383 B1 * 3/2021 Lekkala ............... G11C 7/1087
2006/0146958 A1 * 7/2006 Doi ..................... H04L 25/0292
375/318

* cited by examiner

*Primary Examiner* — Tomi Skibinski
(74) *Attorney, Agent, or Firm* — Merchant & Gould P.C.

(57) ABSTRACT

A circuit includes cross coupled invertors including a first invertor and a second invertor. The first invertor and the second invertor are cross coupled at a first data node and a second data node. An input unit is coupled between the cross-coupled invertors and a power node. The input unit controls the cross-coupled invertors in response to a first input signal received at a first input terminal of the input unit and a second input signal received at a second input terminal of the input unit. A first transistor is connected between the power node and a supply node. The first transistor connects the power node to the supply node in response to an enable signal changing to a first value. A second transistor is connected between the power node and ground. The second transistor connects the power node to the ground in response to the enable signal changing to a second value.

20 Claims, 5 Drawing Sheets

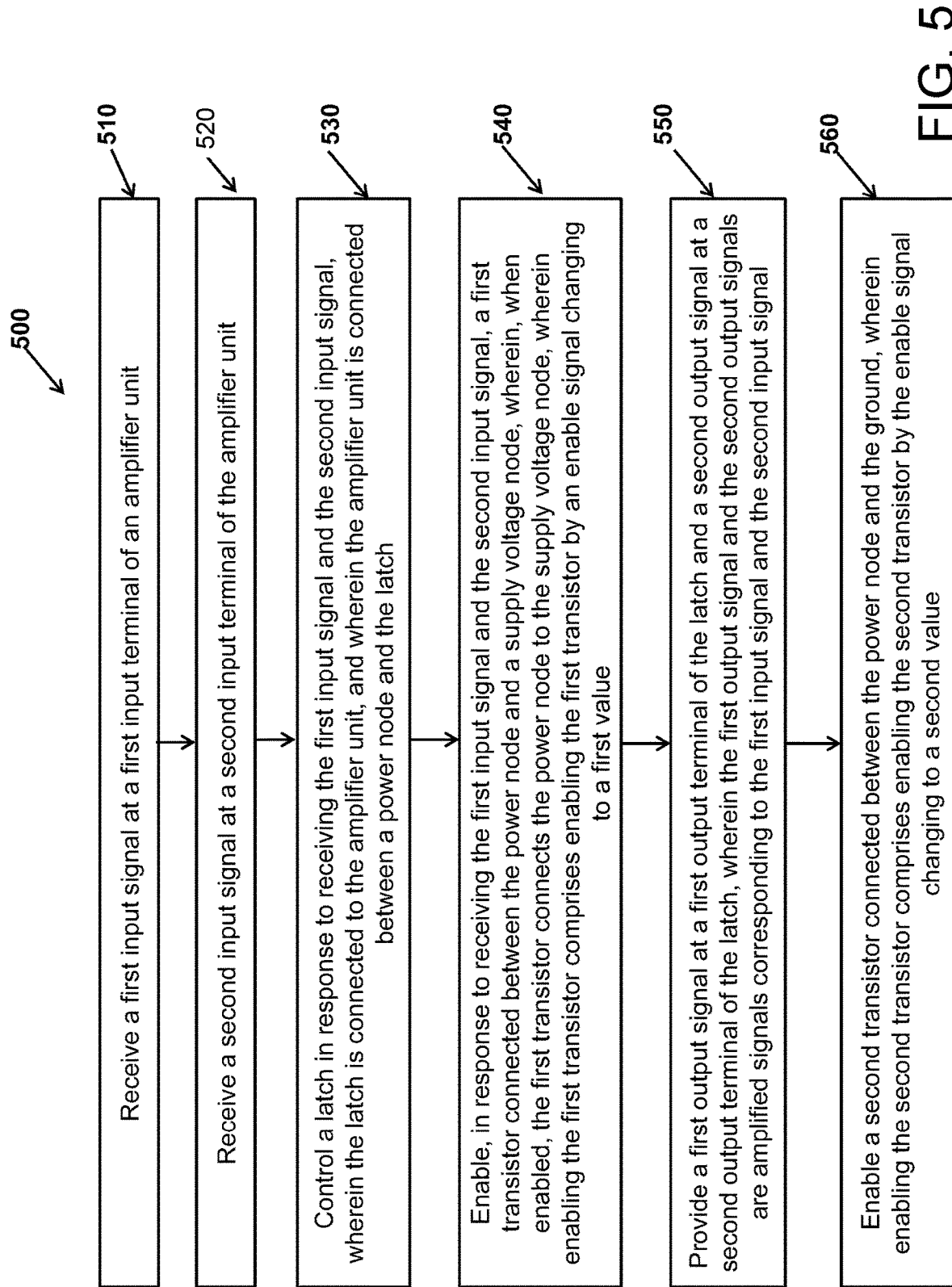

LATCH

CROSS-REFERENCE TO RELATED APPLICATIONS

This application is a continuation of U.S. application Ser. No. 17/162,440, filed Jan. 29, 2021, and titled "LATCH," now U.S. Pat. No. 11,469,745, the disclosure of which is hereby incorporated herein by reference.

BACKGROUND

A latch is a circuit that has two stable states and is used to store information, that is, a data storage element. A latch stores a single bit of data. For example, one of two states of a latch represents a bit value of one and the other represents a bit value of zero. A latch can change state by signals applied to one or more control inputs and can have one or two outputs. A latch is a basic storage element in a sequential logic. For example, latches are fundamental building blocks of digital electronics systems used in computers, communications, and many other types of systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a flow diagram illustrating an example method for operating a latch in accordance with some embodiments.

DETAILED DESCRIPTION

Figure 1:
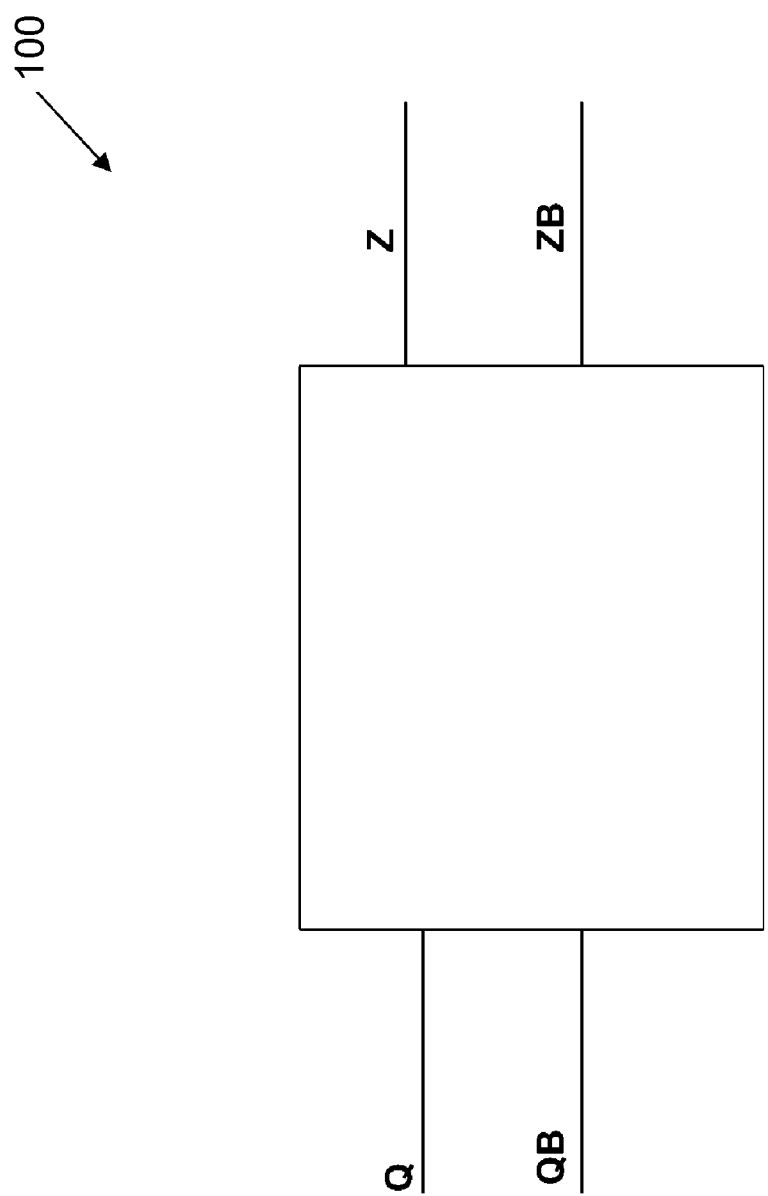
FIG. 1 is a diagram illustrating an example latch in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagram illustrating an example latch 100 in accordance with some embodiments. As shown in FIG. 1, latch 100 includes a first input terminal (also referred to as a terminal Q) and a second input terminal (also referred to as a terminal QB). In addition, latch 100 includes a first output terminal (also referred to as a terminal Z) and a second output terminal (also referred to as a terminal ZB). In examples, the terminal QB is complementary to the terminal Q and the terminal ZB is complementary to terminal Z.

Two input terminals, that is, the terminal Q and the terminal QB are used for set and reset latch 100. Setting latch 100 is equivalent to storing a bit value 1. At set, the terminal Z will become a logic high and the terminal ZB will become a logic low. Reset has the opposite effect. When both inputs, that is, the terminal Q and the terminal QB are at a logic low, a current state of latch 100 is retained. In some examples, latch 100 can operate as a sense amplifier. For examples, latch 100 can receive differential input signals at the terminal Q and the terminal QB, amplify the received differential input signals, and provide amplified output signals at the terminal Z and the terminal ZB.

Figure 2:
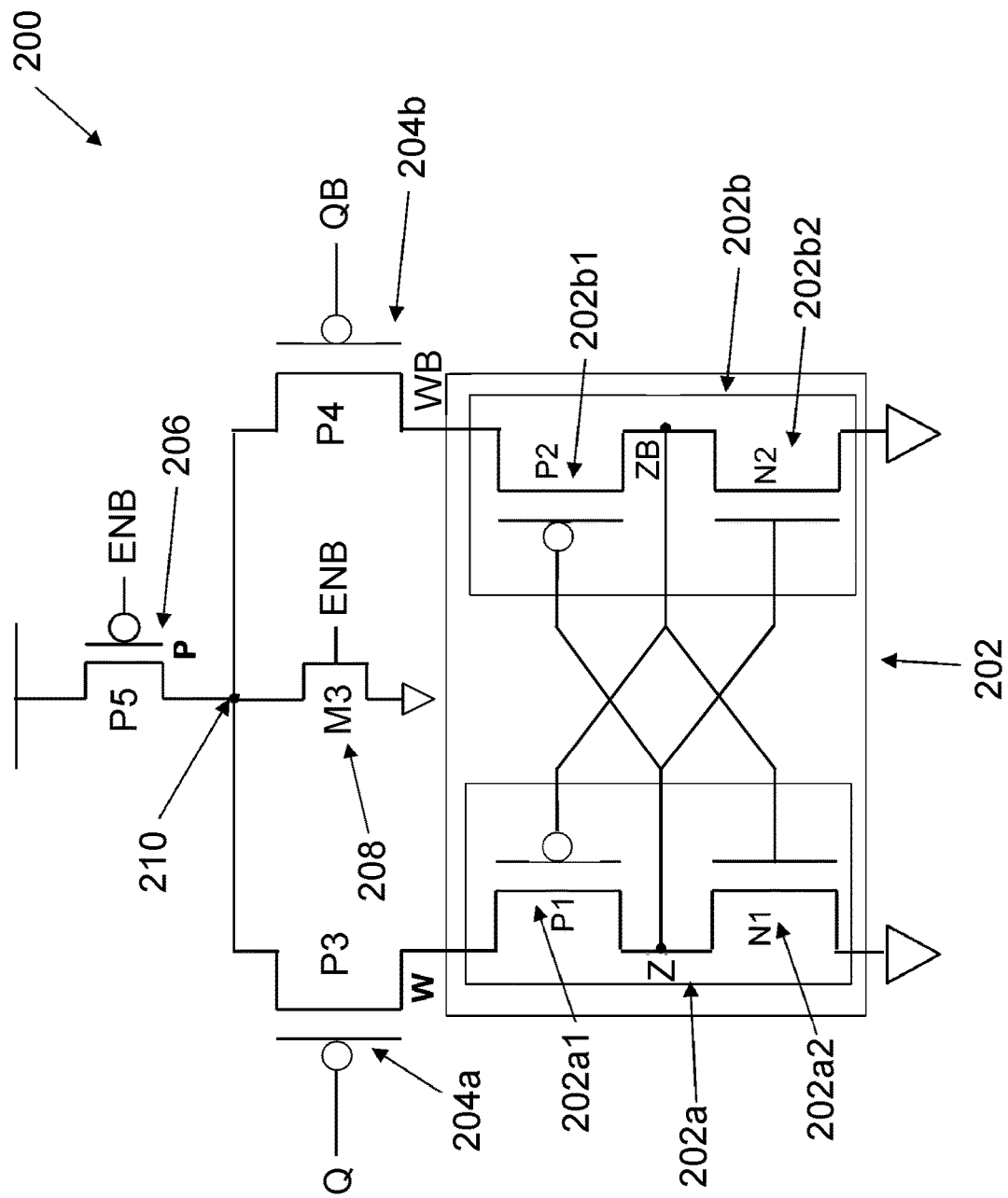
FIG. 2 is a circuit diagram of an example latch in accordance with some embodiments.

FIG. 2 is a circuit diagram of latch 100 in accordance with some embodiments. For example, and as shown in FIG. 2, latch 100 includes cross-coupled invertors 202. Cross coupled invertors 202 store a first bit value at a node Z and a second bit value at a node ZB. Hence, the node Z may also be referred to as a first data node and the node ZB may also be referred to as a second data node. The terminal Z is connected to the node Z and the terminal ZB is connected to the node ZB. In examples, the node ZB is complementary to the node Z.

As shown in FIG. 2, cross coupled invertors 202 includes a first invertor 202a and a second invertor 202b. First invertor 202a is connected between a node W (also referred to as a first internal node) and ground. Second invertor 202b is connected between a node WB (also referred to as a second internal node) and ground. In examples, first invertor 202a is cross coupled with second invertor 202b at the node Z and the node ZB.

First invertor 202a includes a first invertor first transistor 202a1 and a first invertor second transistor 202a2. A source of first invertor first transistor 202a1 is connected to the node W and a drain of first invertor first transistor 202a1 is connected to the node Z. A source of first invertor second transistor 202a2 is connected to the node Z and a drain of first invertor second transistor 202a2 is floating or connected to ground (that is, VSS). A gate of each of first invertor first transistor 202a1 and first invertor second transistor 202a2 is connected to the node ZB thereby cross-coupling first invertor 202a1 with second invertor 202a2.

In examples, first invertor first transistor 202a1 is a p-channel metal oxide semiconductor (pMOS) transistor and first invertor second transistor 202a2 is an n-channel metal oxide semiconductor (nMOS) transistor. However, it will be apparent to a person with an ordinary skill in the art after reading this this disclosure that other types of transistors, such as, a metal oxide semiconductor field effect transistor (MOSFET), an nMOS transistor, a pMOS transistors, or a complementary metal oxide semiconductor (CMOS) transistor can be used for each of first invertor first transistor 202a1 and first invertor second transistor 202a2. In addition, each of first invertor first transistor 202a1 and first invertor second transistor 202a2 is symmetrical. That is, a source of each of first invertor first transistor 202a1 and first invertor second transistor 202a2 can be a drain, and a drain can be a source.

Second invertor 202b includes a second invertor first transistor 202b1 and a second invertor second transistor 202b2. A source of second invertor first transistor 202b1 is connected to the node WB and a drain of second invertor first transistor 202b1 is connected to the node ZB. A source of second invertor second transistor 202b2 is connected to the node ZB and a drain of second invertor second transistor 202b2 is floating or connected to ground (that is, VSS). A gate of each of second invertor first transistor 202b1 and second invertor second transistor 202b2 is connected to the node Z thereby cross-coupling second invertor 202a2 with first invertor 202a1.

In examples, second invertor first transistor 202b1 is a pMOS transistor and second invertor second transistor 202b2 is an nMOS transistor. However, it will be apparent to a person with an ordinary skill in art after reading this disclosure that other types of transistors, such as, a MOSFET, an nMOS transistor, a pMOS transistors, or a CMOS transistor can be used for each of second invertor first transistor 202b1 and second invertor second transistor 202b2. In addition, each of second invertor first transistor 202b1 and second invertor second transistor 202b2 is symmetrical. That is, a source of each of second invertor first transistor 202b1 and second invertor second transistor 202b2 can be a drain, and a drain can be a source.

Continuing with FIG. 2, latch 100 further includes a third transistor 204a and a fourth transistor 204b. In examples, third transistor 204a and fourth transistor 204b together form an input unit which is operative to control cross coupled invertors 202. For example, when enabled, third transistor 204a connects first invertor 202a of cross coupled invertors 202 to a supply voltage. Similarly, when enabled, fourth transistor 204b connects second invertor 202b cross coupled invertors 202 to the supply voltage. In some examples, third transistor 204a is enabled in response to receiving the first input signal at the terminal Q and fourth transistor 204b is enabled in response to receiving the second input signal at the terminal QB. For example, third transistor 204a is enabled in response to sensing a bit line current at a selected bit line of a memory device at the terminal Q and fourth transistor 204b is enabled in response to sensing a complementary bit line current at a selected complementary bit line of the memory device at the terminal QB.

As shown in FIG. 2, a source of third transistor 204a is connected to a node 210 (also referred to as a power node) and a drain of third transistor 204a is connected to the node W. A gate of third transistor 204a is connected to the terminal Q. In addition, a source of fourth transistor 204b is connected to node 210 (that is, the power node) and a drain of fourth transistor 204b is connected to the node WB. A gate of fourth transistor 204b is connected to the terminal QB. The terminal Q and the terminal QB are also referred to as differential input terminals.

In examples, each of third transistor 204a and fourth transistor 204b are pMOS transistors. However, it will be apparent to person with an ordinary skill in the art after reading this disclosure that other types of transistors, such as, a MOSFET, an nMOS transistor, or a CMOS transistor can be used for each of third transistor 204a and fourth transistor 204b. In addition, each of third transistor 204a and fourth transistor 204b is symmetrical. That is, a source of each of third transistor 204a and fourth transistor 204b can be a drain, and a drain can be a source.

Continuing with FIG. 2, latch 100 further includes a fifth transistor 206. Fifth transistor 206 is connected between a supply voltage node and the power node (that is, node 210). A source of fifth transistor 206 is connected to the supply voltage node which is at a predetermined voltage or at the supply voltage (that is, VDD). A drain of fifth transistor 206 is connected to node 210 (that is, the power node). A gate of fifth transistor 206 is connected to a terminal ENB. Terminal ENB is operative to receive the enable signal.

When enabled, fifth transistor 206 is operative to connect the supply voltage node to the power node. Hence, and in some examples, fifth transistor 206 is also referred to as a pull-up transistor, as, when enabled fifth transistor 206 connects node 210 (that is, the power node) to a supply voltage (that is, VDD). In examples, fifth transistor 206 is enabled by an enable signal. For example, fifth transistor 206 is switched on when the enable signal changes to a first logic value (for example, logic low) connecting the power node to the supply voltage. Fifth transistor 206 is switched off when the enable signal changes to a second logic value (for example, logic high) disconnecting the power node from the supply voltage node.

In examples, fifth transistor 206 is a pMOS transistor. However, it will be apparent to a person with an ordinary skill in the art after reading this disclosure that other types of transistors, such as, a MOSFET, an nMOS transistor, or a CMOS transistor can be used for fifth transistor 206. In addition, fifth transistor 206 is symmetrical. That is, a source of fifth transistor 206 can be a drain, and a drain can be a source.

Still continuing with FIG. 2, latch 100 further includes a sixth transistor 208. Sixth transistor 206 is connected between the power node (that is, node 210) and ground. For example, a source of sixth transistor 208 is connected to node 210 and a drain of sixth transistor 208 is connected to ground (that is, VSS). A gate of sixth transistor 208 is connected to a terminal ENB.

When enabled, sixth transistor 208 is operative to connect the power node (that is, node 210) to ground. Hence, and in some examples, sixth transistor 208 is also referred to as a pull-down transistor as when enabled sixth transistor 208 connects node 210 (that is, the power node) to the ground. In examples, fifth transistor 206 is also enabled by the enable signal. For example, sixth transistor 208 is switched on when the enable signal changes to a second logic value (for example, logic high) connecting the power node to ground. Sixth transistor 208 is switched off when the enable signal changes to a first logic value (for example, logic low) disconnecting the supply node from ground. Thus, and in accordance with example embodiments, sixth transistor 208 is switched off when fifth transistor 206 is switched on and sixth transistor 208 is switched on when fifth transistor 206 is switched off.

Terminal ENB is operative to receive the enable signal. In examples, sixth transistor 208 is an nMOS transistor. However, it will be apparent to a person with an ordinary skill in the art after reading this disclosure that sixth transistor 208 can include other types of transistors, such as, a MOSFET, a pMOS transistors, or a CMOS transistor. In addition, sixth transistor 208 is symmetrical. That is, a source of sixth transistor 208 can be a drain, and a drain can be a source.

Figure 3:
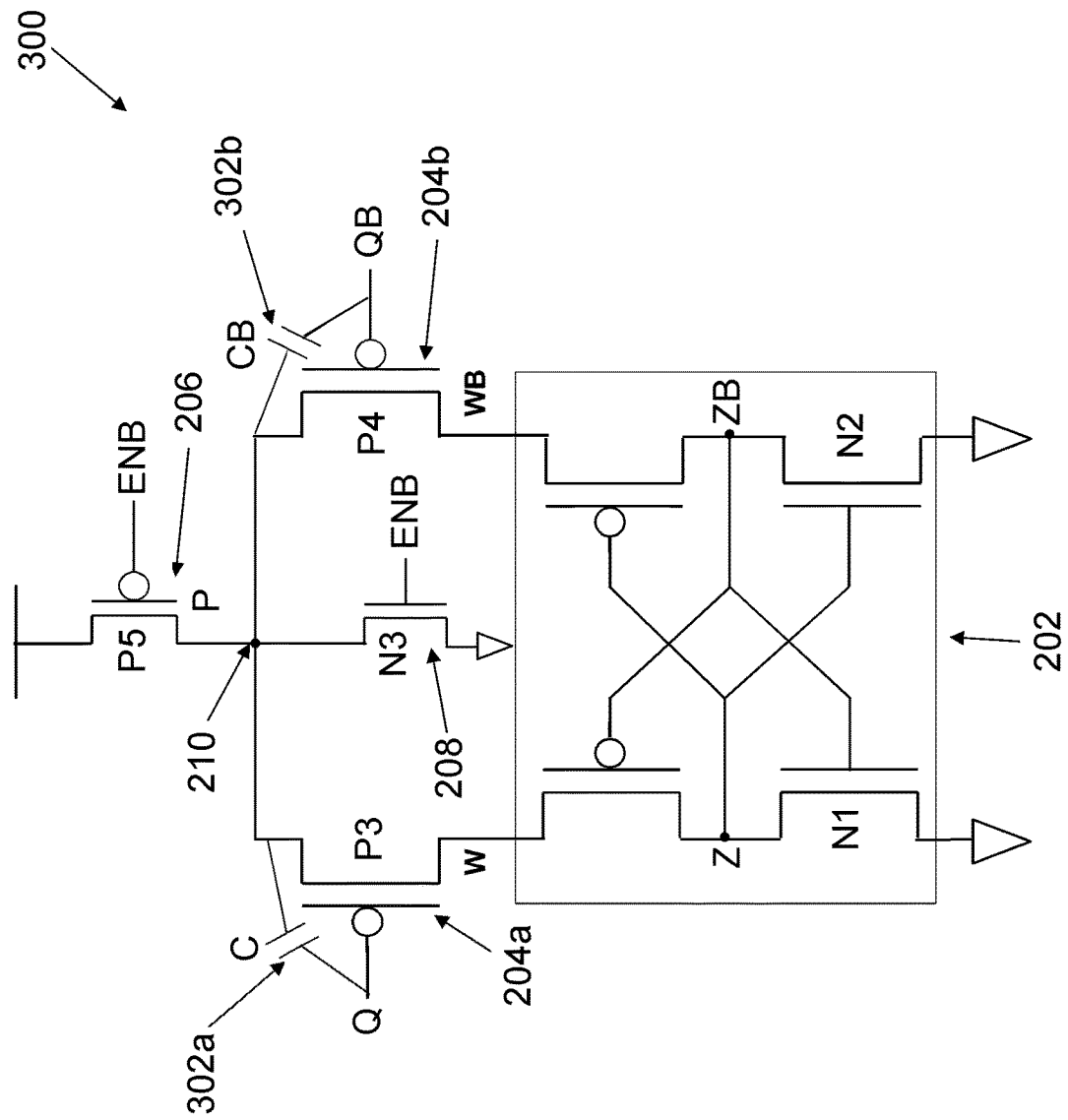
FIG. 3 is a diagram illustrating an example latch with parasitic capacitors in accordance with some embodiments.

FIG. 3 is a diagram illustrating parasitic capacitors of latch 100. For example, and as shown in FIG. 3, latch 100 includes a first parasitic capacitance C 302a and a second parasitic capacitance C 302b. First parasitic capacitance C 302a is formed between the terminal Q and the power node (that is, node 210). Second parasitic capacitance C 302b is formed between the power node (that is, node 210) and the terminal QB.

In example embodiments, first parasitic capacitance C 302a and second parasitic capacitance C 302b do not form a coupling path between the first input terminal and the second input terminal (that is, between the terminal Q and the terminal QB). For example, when the enable signal is at a logic low, fifth transistor 206 is switched on which interrupts forming of a coupling path between first parasitic capacitance C 302a and second parasitic capacitance C 302b. Similarly, when the enable signal is at a logic high, sixth transistor 208 is switched on which interrupts forming of a coupling path between first parasitic capacitance C 302a and second parasitic capacitance C 302b. Therefore, and in accordance with example embodiments, latch 100 or components of latch 100 can be shared with another latch without coupling of input signals though parasitic capacitors associated with latch 100.

Figure 4:
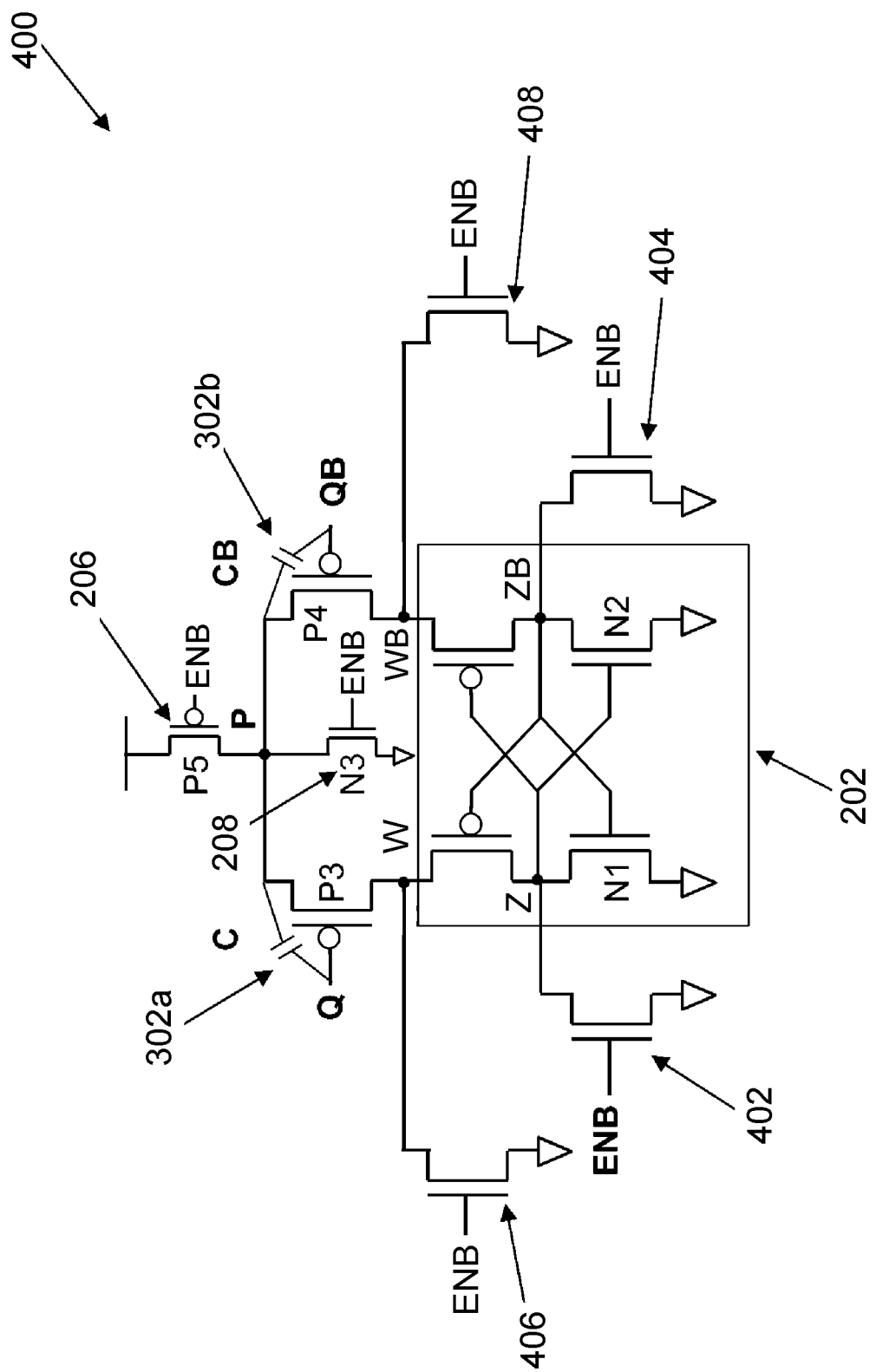
FIG. 4 is a diagram illustrating an example latch with initial transistors in accordance with some embodiments.

FIG. 4 is a diagram illustrating enabling transistors of latch 100. For example, and as shown in FIG. 4, latch 100 includes a first enable transistor 402 and a second enable transistor 404. First enable transistor 402 and second enable transistor 404 are used to enable or operate cross-coupled invertors 202. For example, a source of first enable transistor 402 is connected to the node Z of cross-coupled invertors 202 and a drain of first enable transistor 402 is connected to ground (that is, VSS). A gate of first enable transistor 402 is connected to a terminal ENB. First enable transistor 402 is enabled when the enable signal is at a logic high. When enabled, first enable transistor 402 connects the node Z of cross-coupled invertors 202 to the ground (that is, sets the node Z to a logic value "0").

Similarly, a source of second enable transistor 404 is connected to the node ZB of cross-coupled invertors 202 and a drain of second enable transistor 404 is connected to ground (that is, VSS). A gate of second enable transistor 404 is connected to a terminal ENB. Second enable transistor 404 is enabled when the enable signal is at a logic high. When enabled, second enable transistor 404 connects the node ZB of cross-coupled invertors 202 to the ground (that is, sets the node ZB to a logic value "0"). In examples, each of first enable transistor 402 and second enable transistor 404 are enabled at an evaluation phase of latch 100, and when enabled set each of the node Z and the node ZB of cross-coupled invertors 202 to a logic low (that is, a logic value "0") respectively.

In examples, each of first enable transistor 402 and second enable transistor 404 is an nMOS transistor. However, it will be apparent to a person with an ordinary skill in the art after reading this disclosure that each of first enable transistor 402 and second enable transistor 404 can include other types of transistors, such as, a MOSFET, a pMOS transistors, or a CMOS transistor. In addition, each of first enable transistor 402 and second enable transistor 404 is symmetrical. That is, a source of each of first enable transistor 402 and second enable transistor 404 can be a drain, and a drain can be a source.

Continuing with FIG. 4, latch 100 further includes a third enable transistor 406 and a fourth enable transistor 408. A source of third enable transistor 406 is connected to the node W and a drain of third enable transistor 406 is connected to the ground (that is, VSS). A gate of third enable transistor 406 is connected to a terminal ENB. Third enable transistor 406 is enabled when the enable signal is at a logic high. When enabled, third enable transistor 406 connects the node W to the ground (that is, sets the node W to a logic value "0").

A source of fourth enable transistor 408 is connected to the node WB and a drain of fourth enable transistor 408 is connected to ground (that is, VSS). A gate of fourth enable transistor 408 is connected to a terminal ENB. Fourth enable transistor 408 is enabled when the enable signal is at a logic high. When enabled, fourth enable transistor 408 connects the node WB to the ground (that is, sets the node WB to a logic value "0"). In examples, each of third enable transistor 406 and fourth enable transistor 408 are enabled at an evaluation phase of latch 100, and when enabled set the node W and the node WB to a logic low (that is, a logic value "0") respectively. In example embodiments, the evaluation phase determines actual logical response of latch 100.

In examples, each of third enable transistor 406 and fourth enable transistor 408 is an nMOS transistor. However, it will be apparent to a person with an ordinary skill in the art after reading this disclosure that each of third enable transistor 406 and fourth enable transistor 408 can include other types of transistors, such as, a MOSFET, a pMOS transistors, or a CMOS transistor. In addition, each of third enable transistor 406 and fourth enable transistor 408 is symmetrical. That is, a source of each of third enable transistor 406 and fourth enable transistor 408 can be a drain, and a drain can be a source.

In example embodiments, after evaluation phase, the enable signal is changed from a logic high to a logic low (that is, from a logic value "1" to a logic value "0"). This is also referred to as a latch phase. When the enable signal is changes to a logic low, each of first enable transistor 402, second enable transistor 404, third enable transistor 406, and fourth enable transistor 408 are switched off disconnecting the node Z, the node ZB, the node W, and the node WB from the ground respectively. In addition, in the latch phase, that is, when the enable signal is a logic low, fifth transistor 206 is switched on connecting node 210 to the supply voltage (that is, VDD) and sixth transistor 208 is switched off disconnecting node 210 from ground. This switches on both third transistor 204a and fourth transistor 204b which results in setting of the node Z and the node ZB.

FIG. 5 is a flow diagram illustrating a method 500 for operating a latch in accordance with some embodiments. For example, method 500 may be implemented to operate latch 100 described with reference to FIGS. 1-5. In addition, steps of method 500 may be stored as instructions in a memory device or in a computer readable medium which may be executed by a processor to implement method 500. The computer readable medium may be a non-transitory computer readable medium.

At block 510 of method 500, a first input signal is received at a first input terminal of an input unit. For example, a first input signal, such as, a bit line current is received at terminal Q of third transistor 204a of latch 100 of FIG. 2. At block 520 of method 500 a second input signal is received at a second input terminal of the input unit. For example, a second input signal, such as, a complementary bit line current is received at terminal QB of fourth transistor 204b of latch 100 of FIG. 2.

At block 530 of method 500 cross-coupled invertors are controlled in response to receiving the first input signal and the second input signal. For example, cross-coupled invertors 202 of latch 100 of FIG. 2 are controlled in response to receiving the first input signal at terminal Q of third transistor 204a of latch 100 and the second input signal at terminal Q of third transistor 204a of latch 100. Cross-coupled invertors 202 of latch 100 are enabled, that is, connected to the power node (that is, node 210 of latch 100) in response to receiving the first input signal and the second input signal at the input unit.

At block 540 of method 500 a first transistor connected between the power node and a supply node is enabled in response to receiving the first input signal and the second input signal. When enabled, the first transistor (that is, the pull-up transistor) connects the power node to the supply node. The first transistor is enabled by an enable signal changing to a first value. For example, fifth transistor 206 of latch 100 of FIG. 2 is enabled when the enable signal changes to a logic low. When enabled, fifth transistor 206 connected to the power node (that is, node 210) with the voltage supply node.

At block 550 of method 500 a first bit is stored at the first node of the latch and a second bit is stored at a second node of the latch. For example, the bit 1 or bit 0 is stored at node Z of latch 100 and the bit 0 or bit 1 is stored at the node ZB of latch 100.

At block 560 of method 500, a second transistor connected between the power node and the ground is enabled. When enabled, the second transistor (that is, the pull-down transistor) connects the power node to ground. The second transistor is enabled in response to the enable signal changing to a second value from a first value. For example, sixth transistor 208 of latch 100 of FIG. 2 is enabled when the enable signal changes to a logic high. When enabled, sixth transistor 208 connects the power node (that is, node 210) to ground. In example embodiments, the pull-down transistor is enabled when the pull-up transistor is not enabled. That is, sixth transistor 208 is enabled when fifth transistor 206 is not enabled. That is, one of fifth transistor 206 and sixth transistor 208 is enabled to inhibit coupling of first parasitic capacitor C 302a and second parasitic capacitor C 302b between the terminal Q and the terminal QB.

In accordance with example embodiments a circuit comprises: cross coupled invertors comprising a first invertor and a second inventor, wherein the first invertor and the second invertor are cross coupled at a first data node and a second data node; an input unit coupled between the cross-coupled invertors and a power node, wherein the input unit controls the cross-coupled invertors in response to a first input signal received at a first input terminal of the input unit and a second input signal received at a second input terminal of the input unit; a first transistor connected between the power node and a supply node, wherein the first transistor connects the power node to the supply node in response to an enable signal changing to a first value; and a second transistor connected between the power node and ground, wherein the second transistor connects the power node to the ground in response to the enable signal changing to a second value.

In example embodiments, a latch comprises: a first transistor, wherein a source of the first transistor is connected to a first internal node and a drain of the first transistor is connected to a first data node; a second transistor, wherein a source of the second transistor is connected to the first data node and a drain of the second transistor is connected to a ground, and wherein a gate of the second transistor is connected to a gate of the first transistor at a second data node; a third transistor, wherein a source of the third transistor is connected to a second internal node and a drain of the third transistor is connected to the second data node; a fourth transistor, wherein a source of the fourth transistor is connected to the second data node and a drain of the fourth transistor is connected to the ground, and wherein a gate of the fourth transistor is connected to a gate of the third transistor at the first data node; a fifth transistor, wherein a source of fifth transistor is connected to a power node, a drain of fifth transistor is connected to the first internal node, and a gate of the fifth transistor is connected to a first input terminal; a sixth transistor, wherein a source of the sixth transistor is connected to the power node, a drain of sixth transistor is connected to the second internal node, and a gate of the sixth transistor is connected to a second input terminal; a seventh transistor, wherein a source of the seventh transistor is connected to a supply voltage node and a drain of the seventh transistor is connected the power node, wherein the seventh transistor, when enabled, connects the power node to the supply voltage node; and an eighth transistor, wherein a source of the eighth transistor is connected to the power node and a drain of the eighth transistor is connected to the ground, wherein the eighth transistor, when enabled, connects the power node to the ground, and wherein the latch is operative to store a first bit value at the first data node and store a second bit value at the second data node.

In accordance with example embodiments a method for operating a latch comprises: receiving a first input signal at a first input terminal of an input unit of a latch; receiving a second input signal at a second input terminal of the input unit; controlling cross-coupled invertors of the latch in response to receiving the first input signal and the second input signal, wherein the cross-coupled invertors are connected to the input unit, and wherein the input unit is connected between a power node and the cross-coupled invertors; enabling, in response to receiving the first input signal and the second input signal, a first transistor connected between the power node and a supply voltage node, wherein, when enabled, the first transistor connects the power node to the supply voltage node, wherein enabling the first transistor comprises enabling the first transistor by an enable signal changing to a first value; storing a first bit value at a first data node of the latch and a second bit value at a second data node of the latch; and enabling a second transistor connected between the power node and the ground, wherein enabling the second transistor comprises enabling the second transistor by the enable signal changing to a second value.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A latch comprising:
a first transistor, wherein a source of the first transistor is connected to a first internal node and a drain of the first transistor is connected to a first data node;
a second transistor, wherein a source of the second transistor is connected to the first data node and a drain of the second transistor is connected directly to ground, and wherein a gate of the second transistor and a gate of the first transistor are connected to a second data node;

a third transistor, wherein a source of the third transistor is connected to a second internal node and a drain of the third transistor is connected to the second data node, and wherein the second internal node is different from the first internal node;

a fourth transistor, wherein a source of the fourth transistor is connected to the second data node and a drain of the fourth transistor is directly connected to the ground, and wherein a gate of the fourth transistor and a gate of the third transistor are connected to the first data node;

an input circuit coupled between a power node and the first internal node and the second internal node;

a fifth transistor connected between the power node and a supply node, wherein the supply node is different than the first and second internal nodes, wherein the fifth transistor connects the power node to the supply node in response to an enable signal changing to a first value, and wherein the enable signal changes to the first value during a latch phase; and a sixth transistor connected between the power node and the ground, wherein the sixth transistor connects the power node to the ground and disconnects the power node from the supply node in response to the enable signal changing to a second value.

2. The latch of claim 1, wherein the input circuit comprises a seventh transistor and an eighth transistor, wherein each of the seventh transistor and the eighth transistor are PMOS transistors, wherein a source of the seventh transistor is connected to the power node and a drain of the seventh transistor is connected to the first internal node, and wherein a source of the eighth transistor is connected to the power node and a drain of the eighth transistor is connected to the second internal node.

3. The latch of claim 2, wherein a gate of the seventh transistor is connected to the first input terminal and a gate of the eighth transistor is connected to the second input terminal.

4. The latch of claim 3, wherein the seventh transistor connects the first internal node to the power node in response to the first input signal changing to the first value, and wherein the eighth transistor connects the second internal node to the power node in response to the first input signal changing to the first value.

5. The latch of claim 1, wherein the fifth transistor is a PMOS transistor having a gate terminal connected to receive the enable signal, a source terminal connected to the supply node and a drain terminal connected to the power node, wherein the sixth transistor is an NMOS transistor having a gate terminal connected to receive the enable signal, a source terminal connected to the power node and a drain terminal connected to the ground.

6. The latch of claim 1, further comprising a first enable transistor and a second enable transistor, wherein each of the first and second enable transistors both being are NMOS transistors, wherein a source of the first enable transistor is connected to the first data node, a drain of the first enable transistor is connected to the ground, and a gate of the first enable transistor is connected to an enable terminal, and wherein a source of the second enable transistor is connected to the second data node, a drain of the second enable transistor is connected to the ground, and a gate of the second enable transistor is connected to the enable terminal.

7. The latch of claim 6, wherein the first enable transistor and the second enable transistor set the first data node and the second data node to a bit value zero in response to the enable signal changing to the second value.

8. The latch of claim 7, further comprising a third enable transistor and a fourth enable transistor, the third and fourth enable transistors both being NMOS transistors, wherein a source of the third enable transistor is connected to the first internal node, a drain of the third enable transistor is connected to the ground, and a gate of the third enable transistor is connected to the enable terminal, and wherein a source of the fourth enable transistor is connected to the second internal node, a drain of the fourth enable transistor is connected to the ground, and a gate of the fourth enable transistor is connected to the enable terminal.

9. The latch of claim 8, wherein the third enable transistor and the fourth enable transistor set the first internal node and the second internal node to a bit value zero in response to the enable signal changing to the second value.

10. A latch comprising:
cross coupled invertors comprising a first invertor and a second inventor, wherein a first end of the first invertor is connected to a first internal node and a second end of the first invertor is directly connected to the ground, wherein a first end of the second invertor is connected to a second internal node and a second end of the second invertor is directly connected the ground, wherein the second internal node is different from the first internal node, and wherein the first invertor and the second invertor are cross coupled at a first data node and a second data node;

a first transistor, wherein a source of first transistor is connected to a power node, a drain of first transistor is connected to the first internal node, and a gate of the first transistor is connected to a first input terminal;

a second transistor, wherein a source of the second transistor is connected to the power node, a drain of second transistor is connected to the second internal node, and a gate of the second transistor is connected to a second input terminal;

a third transistor connected between a supply voltage node and the power node, wherein the supply voltage node is different than the first internal node and the second internal node, and wherein the third transistor connects the power node to the supply voltage node in response to an enable signal changing to a first value; and a fourth transistor connected between the power node and the ground, wherein the fourth transistor connects the power node to the ground in response to an enable signal changing to a second value.

11. The latch of claim 10, wherein the first transistor and the second transistor form an input circuit, wherein the input circuit is operative to receive differential input signals at the first input terminal and the second input terminals.

12. The latch of claim 11, wherein the cross-coupled invertors are enabled in response to receiving the differential input signals.

13. The latch of claim 10, further comprising a first enable transistor and a second enable transistor, wherein a source of the first enable transistor is connected to the first data node, a drain of the first enable transistor is connected to the ground, and a gate of the first enable transistor is connected to an enable terminal, and wherein a source of the second enable transistor is connected to the second data node, a drain of the second enable transistor is connected to the ground, and a gate of the second enable transistor is connected to the enable terminal.

14. The latch of claim 13, wherein when enabled the first enable transistor and the second enable transistor set the first data node and the second data node to a bit value zero respectively.

15. A method for operating a latch, the method comprising:
receiving a first input signal at a first input terminal of an input circuit of a latch;
receiving a second input signal at a second input terminal of the input circuit of the latch, wherein the latch comprises-cross-coupled invertors, wherein a first end of a first invertor of the cross-coupled invertors is connected to a first internal node and a second end of a second end of the first invertor is connected directly to the ground, wherein a first end of a second invertor of the cross-coupled invertors is connected to a second internal node and a second end of the second invertor is connected directly to the ground, wherein the second internal node is different from the first internal node, wherein the cross-coupled invertors are connected to the input circuit, and wherein the input circuit is connected between a power node and the first internal node and the second internal node;
enabling, in response to receiving the first input signal and the second input signal, a first transistor connected between the power node and a supply voltage node, wherein the supply voltage node is different than the first and second internal nodes, wherein, when enabled, the first transistor connects the power node to the supply voltage node, wherein enabling the first transistor comprises enabling the first transistor by an enable signal changing to a first value, and wherein the enable signal changes to the first value during a latch phase; and
enabling, in response to the enable signal changing to a second value, a second transistor connected between the power node and the ground to connect the power node to the ground.

16. The method of claim 15, further comprising storing a first bit value at a first data node of the latch and a second bit value at a second data node of the latch.

17. The method of claim 15, further comprising:
changing the enable signal to the second value;
setting the first internal node and the second internal node to a bit value of zero; and
setting the first data node and the second data node to a bit value zero.

18. The method of claim 15, further comprising initiating the latch phase, wherein initiating the latch phase comprising changing the enable signal to the first logic value.

19. The method of claim 15, wherein the second transistor when enabled disconnects the power node from the supply node in response to the enable signal changing to a second value.

20. The method of claim 15, wherein the first input signal and the second input signal are differential input signals.

* * * * *